US008324062B2

(12) United States Patent
Kopta et al.

(10) Patent No.: US 8,324,062 B2
(45) Date of Patent: Dec. 4, 2012

(54) METHOD FOR MANUFACTURING A POWER SEMICONDUCTOR DEVICE

(75) Inventors: Arnost Kopta, Zurich (CH); Munaf Rahimo, Uezwil (CH)

(73) Assignee: ABB Technology AG, Zürich (CH)

( * ) Notice: Subject to any disclaimer, the term of this patent is extended or adjusted under 35 U.S.C. 154(b) by 89 days.

(21) Appl. No.: 12/635,975

(22) Filed: Dec. 11, 2009

(65) Prior Publication Data
US 2010/0151650 A1 Jun. 17, 2010

(30) Foreign Application Priority Data

Dec. 12, 2008 (EP) .................................... 08171450

(51) Int. Cl.
*H01L 21/336* (2006.01)
(52) U.S. Cl. ........ 438/305; 438/306; 438/542; 438/566; 438/546; 438/514
(58) Field of Classification Search .................. 438/305, 438/542, 566, 546, 514–534
See application file for complete search history.

(56) References Cited

U.S. PATENT DOCUMENTS

| 3,756,861 | A | * | 9/1973 | Payne et al. | 438/350 |
|---|---|---|---|---|---|
| 5,091,336 | A | * | 2/1992 | Beasom | 438/135 |
| 5,981,343 | A | * | 11/1999 | Magri et al. | 438/268 |
| 6,137,139 | A | * | 10/2000 | Zeng et al. | 257/342 |
| 6,468,866 | B2 | * | 10/2002 | Frisina et al. | 438/268 |
| 6,780,697 | B2 | * | 8/2004 | Sasaki | 438/217 |
| 6,798,040 | B2 | * | 9/2004 | Reznik | 257/565 |
| 6,965,146 | B1 | * | 11/2005 | Wu | 257/328 |
| 6,984,590 | B2 | * | 1/2006 | Han et al. | 438/766 |
| 7,351,637 | B2 | * | 4/2008 | Tucker | 438/289 |
| 2004/0065934 | A1 | | 4/2004 | Sridevan et al. | |
| 2004/0145013 | A1 | * | 7/2004 | Pfirsch | 257/335 |

FOREIGN PATENT DOCUMENTS

| EP | 0 837 508 A2 | 4/1998 |
|---|---|---|
| JP | 3-205832 A | 9/1991 |

OTHER PUBLICATIONS

[Wolf et al. "Silicon Processing for the VLSI Era: Process technology vol. 1"; Pub. Date: Sep. 2000; p. 408].*
[Quirk et al. "Semiconductor Manufacturing Technology" Pub. Date: 2001; p. 502].*
European Search Report dated Mar. 5, 2009.

* cited by examiner

*Primary Examiner* — Jenny L Wagner
*Assistant Examiner* — Dmitriy Yemelyanov
(74) *Attorney, Agent, or Firm* — Buchanan Ingersoll & Rooney PC

(57) ABSTRACT

A method of manufacturing a power semiconductor device is provided. A first oxide layer is produced on a first main side of a substrate of a first conductivity type. A structured gate electrode layer with at least one opening is then formed on the first main side on top of the first oxide layer. A first dopant of the first conductivity type is implanted into the substrate on the first main side using the structured gate electrode layer as a mask, and the first dopant is diffused into the substrate. A second dopant of a second conductivity type is then implanted into the substrate on the first main side, and the second dopant is diffused into the substrate. After diffusing the first dopant into the substrate and before implanting the second dopant into the substrate, the first oxide layer is partially removed. The structured gate electrode layer can be used as a mask for implanting the second dopant.

19 Claims, 4 Drawing Sheets

METHOD FOR MANUFACTURING A POWER SEMICONDUCTOR DEVICE

RELATED APPLICATION

This application claims priority under 35 U.S.C. §119 to European Patent Application No. 08171450.3 filed in Europe on Dec. 12, 2008, the entire content of which is hereby incorporated by reference in its entirety.

FIELD

The present disclosure relates to the field of power electronics and more particularly to a method of manufacturing a power semiconductor device.

BACKGROUND INFORMATION

Prior art IGBTs have a low (n−) doped drift layer with a higher n doped buffer layer on the collector side followed by a collector layer. A p base layer is arranged on the emitter side of the drift layer, which is opposite the collector side. IGBTs have been improved by the introduction of an n doped enhancement layer, which is arranged between and which separates the p base layer and the (n−) drift layer. This leads to an IGBT with an improved safe operating area (SOA) and low on-state losses. The carrier concentration near the active cell is enhanced by such an enhancement layer. In case of a metal-oxide semiconductor field-effect transistor (MOSFET), such an enhancement layer leads to a reduction of the junction field-effect transistor (JFET) effect and also to low on-state losses.

For an IGBT with an n enhancement layer as described above, if the p base layer has a higher depth at the edges of a cell compared to the central region of the cell, this profile for the pn-junction brings the peak field from the periphery of the cell to an area directly under the contact region of the emitter electrode. This position of the peak field results in a much higher SOA turn-off current capability for IGBTs as well as for MOSFETs. In addition, due to the fact that field generated holes can transport directly towards the contact region of the emitter electrode, a critical region near the n+ source regions is avoided which would result in the triggering of the parasitic thyristor and transistor for IGBTs and MOSFETs, respectively.

EP 0 837 508 describes a method for manufacturing an insulated gate bipolar transistor (IGBT) with such a modulated p base layer profile. On a (p+) substrate, first an n buffer layer and then a (n−) layer are formed by epitaxial growth. Afterwards, a thick gate oxide layer is formed on the (n−) layer and shaped in a designated pattern. Then, a thin gate oxide layer is formed on top of the (n−) layer in areas in which no thick oxide layer is formed, followed by the formation of a polysilicon layer on the gate oxide layers as a gate electrode. Then, an open hole is formed in the thin gate oxide layer and the polysilicon layer. Phosphorous is implanted through the open hole into the (n−) layer and diffused into the (n−) layer, using the hole in the polysilicon layer as a mask, resulting in a first n layer. Afterwards, the hole is enlarged and phosphorous is again implanted and diffused, resulting in a second n layer. The depth of the first n layer is greater than the depth of the second n layer. Next, boron is implanted through the same mask of the polysilicon layer and diffused, resulting in a p layer, which is less deep than the second n layer. Thus, the second n layer and the p layer can be made by using the same mask, whereas another mask is used for the manufacturing of the first n layer.

In an alternative technique, as also described in EP 0 837 508, the first n layer is produced after the second n layer, the second n layer is produced by a mask and the implanting and diffusion processes are performed as described above. After producing the second n layer, an insulation film is created on the gate electrode and structured by photoresist. The first n-layer can also be processed before the insulation film. For producing the first n layer, high energy phosphorous ions are directly implanted from the open hole, which is limited by the photoresist and which is thus smaller than the hole used as a mask for the second n layer. The ions are directly implanted into the depth between the second n layer and the (n−) layer. The implantation of high energy phosphorous ions is a complex process for depths exceeding 1 μm as required in the IGBT cell, and the process also involves precise mask alignment in order to place the phosphorous in the middle of the cell.

JP 03-205832 refers to a MOSFET device, which comprises a highly n doped area in the region between the n doped source regions, but below the p doped base region.

US 2004/0065934 shows a MOSFET, in which the p base region has a p doping and is surrounded by another more heavily doped p region.

SUMMARY

An exemplary embodiment provides a method of manufacturing a power semiconductor device. The exemplary method includes: forming a first oxide layer on a first main side of a substrate of a first conductivity type; forming a gate electrode layer with at least one opening on the first main side on top of the first oxide layer; implanting a first dopant of the first conductivity type into the substrate on the first main side using the formed gate electrode layer as a mask; diffusing the first dopant into the substrate; implanting a second dopant of a second conductivity type into the substrate on the first main side; and diffusing the second dopant into the substrate. According to an exemplary embodiment, the first oxide layer is partially removed after diffusing the first dopant into the substrate and before implanting the second dopant into the substrate, and the gate electrode layer is used as a mask for implanting the second dopant.

BRIEF DESCRIPTION OF THE DRAWINGS

Additional refinements, advantages and features of the present disclosure are described in more detail below with reference to exemplary embodiments illustrated in the drawing, in which.

DETAILED DESCRIPTION

Figure 1:
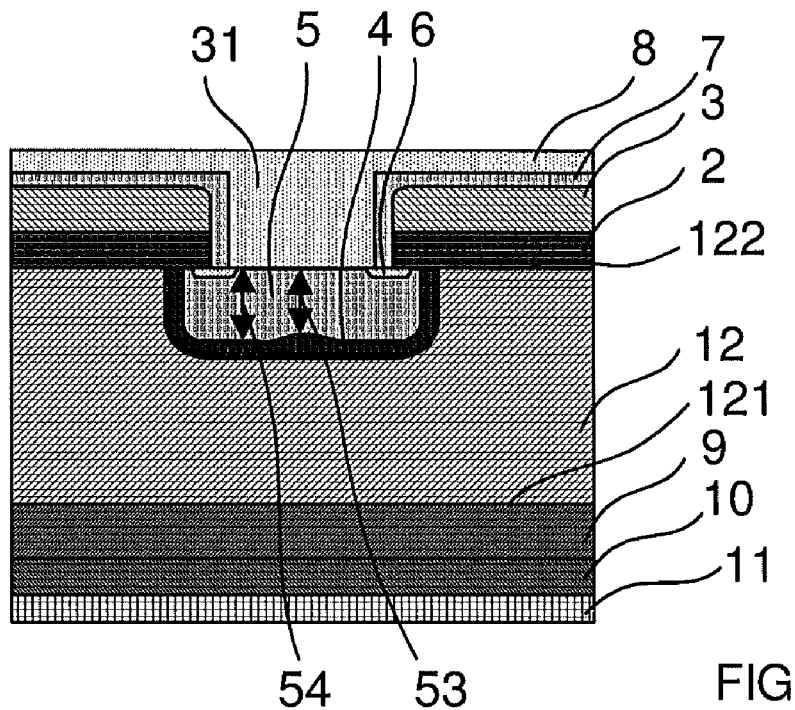
FIG. 1 shows an exemplary insulated gate semiconductor device manufactured according to at least one embodiment of the present disclosure.

Exemplary embodiments of the present disclosure provide a method for manufacturing a power semiconductor device with low on-state losses and high SOA capability. The exemplary method is easier to perform than prior art methods and avoids delicate manufacturing steps.

The inventive method for manufacturing a power semiconductor device can include the following steps:

forming a first oxide layer on a first main side of a substrate of a first conductivity type, forming a structured gate electrode layer with at least one opening on the first main side on top of the first oxide layer, implanting a first dopant of a first conductivity type into the substrate on the first main side using the structured gate electrode layer as a mask, diffusing the first dopant into the substrate, implanting a second dopant of a second conductivity type into the substrate on the first main side, and diffusing the second dopant into the substrate, characterized in that According to an exemplary embodiment, after diffusing the first dopant into the substrate and before implanting the second dopant into the substrate, the first oxide layer is partially removed, resulting in a gate oxide layer, and the structured gate electrode layer can be used as a mask for implanting the second dopant.

The inventive method for manufacturing a power semiconductor device, in particular an IGBT or a MOSFET, provides an advantage in that one single mask is involved for the manufacturing of both the enhancement layer, which is made by the implantation and diffusion of the first dopant of the first conductivity type, and the base layer, which is made by the implantation and diffusion of the second dopant of the second conductivity type. These layers are self-aligned by using the structured gate electrode layer as a mask.

It has been surprisingly found out that due to the removal of the first oxide layer above the openings of the structured gate electrode layer after the diffusion of the first dopant and before the implant of the second dopant, a base layer of the second conductivity type is achieved, which has a lower depth in the central area below the contact area to the emitter electrode and a higher depth in the peripheral area of the base layer of the second conductivity type.

Such a variation of the base layer profile allows operating the semiconductor device with low on-state losses and high SOA capability. The method is preferably used for the manufacturing of IGBTs and MOSFETs.

The reference symbols used in the figures and their meaning are summarized in the list of reference symbols. Generally, similar or similarly-functioning parts are denoted with the same reference symbols. For clarity of illustration, components may be described with directional adjectives such as "upper" and "lower" to denote the respective placement and orientation of various components relative to other components. It is to be understood, however, that the directional adjectives used herein are premised on the orientation of the components as illustrated in the drawings, and that the exemplary embodiments described herein are not limited to the orientation of the components as illustrated in the drawings. The exemplary embodiments described herein are intended to be illustrative examples and shall not confine the present disclosure.

FIG. 1 illustrates a power semiconductor device that is manufactured according to an exemplary method of the present disclosure. An IGBT is shown with a low (n−) doped drift layer 12. The drift layer 12 has a first main side 122 and a second main side 121. In the exemplary embodiment illustrated in FIG. 1, the first main side 122 represents an upper side (surface) of the drift layer 12, while the second main side 121 represents a lower side of the drift layer 12. The first main side 122 is an emitter side. The second main side 121 is a collector side. An n-doped buffer layer 9, which has a higher doping concentration than that of the drift layer 12, is arranged on the collector side 121. A p-doped collector layer 10 is arranged on a lower side of the buffer layer 9 opposite to the upper side of the buffer layer 9 on which the drift layer 12 is arranged. A collector electrode 11 is arranged on a lower side of the p-collector layer 10.

A p-doped base region 5 is arranged on the emitter side 122 of the drift layer 12, and is embedded in an n-doped enhancement layer 4. The enhancement layer 4 has a higher doping concentration than that of the drift layer 12, and the enhancement layer 4 separates the p-base region 5 from the drift layer 12. A gate oxide layer 2, which can be made of $SiO_2$, for example, is arranged on the emitter side 122. The gate oxide layer 2 can be structured by an oxide opening, which leaves a part of the upper surface of the base region 5 uncovered by the gate oxide layer 2. A gate electrode layer 3, which can be made of polysilicon, for example, is arranged on top of the gate oxide layer 2. The gate electrode layer 3 has an opening 31, which can be formed at substantially the same location and be of the same or similar size as opening in the oxide layer 2. The gate electrode layer 3 and the gate oxide layer 2 are covered by an insulation layer 7. An emitter electrode 8 is arranged on top of the insulation layer 7, in the opening of the gate oxide layer 2 and the opening 31 of the gate electrode layer 3. Highly (n+) doped source regions 6 are arranged within the p-doped base region 5. As illustrated in the exemplary configuration of FIG. 1 the source regions 6 can be formed to be in contact with the emitter electrode 8 in the area of the opening 31 and extend at the surface of the emitter side 122 to a region underneath the gate electrode layer 3.

According to an exemplary embodiment, the drift layer 12, the base region 5, the enhancement region 4 and the source regions 6 can form one common planar surface.

The base region 5 has a depth 53 in the central area, which is lower than the maximum depth 54 of the base region 5, which lies outside the central area, i.e. in the peripheral area of the base region 5.

Figure 2:
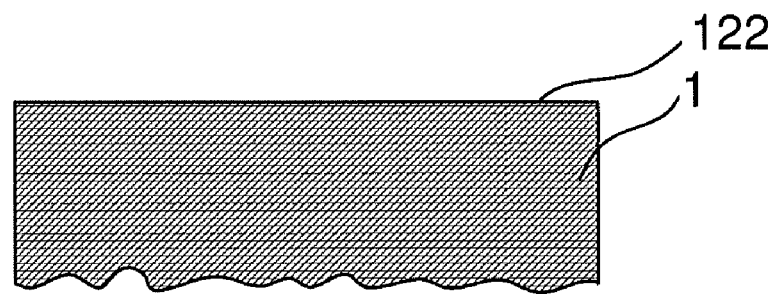
FIGS. 2-10 show different steps of an exemplary method for manufacturing a semiconductor device according to various exemplary embodiments of the present disclosure.
Figure 3:
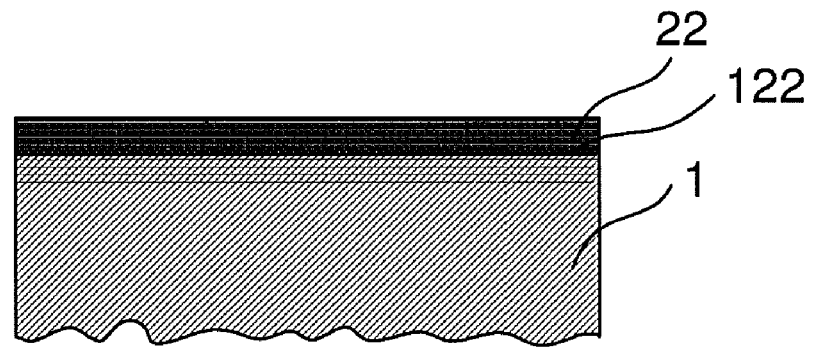
Figure 4:
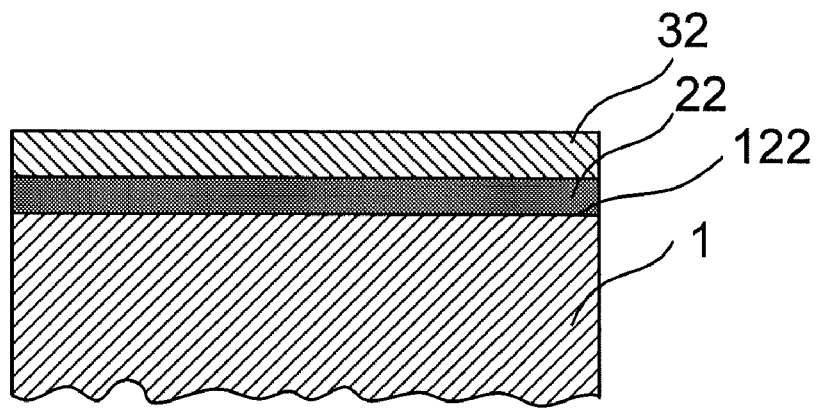
Figure 5:
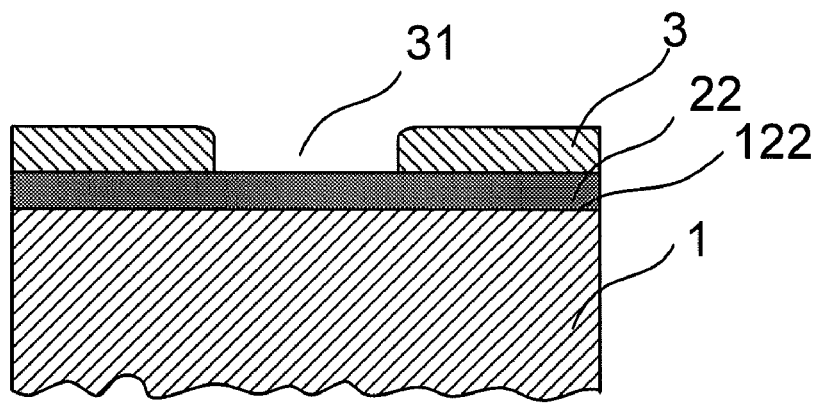
Figure 6:
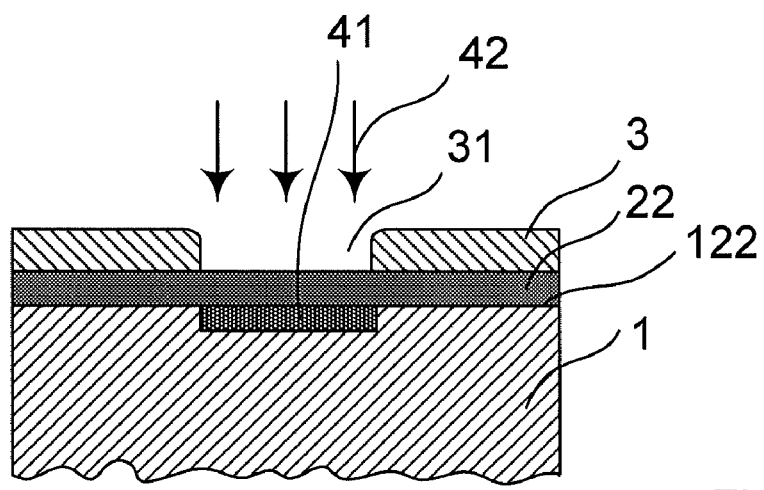
Figure 7:
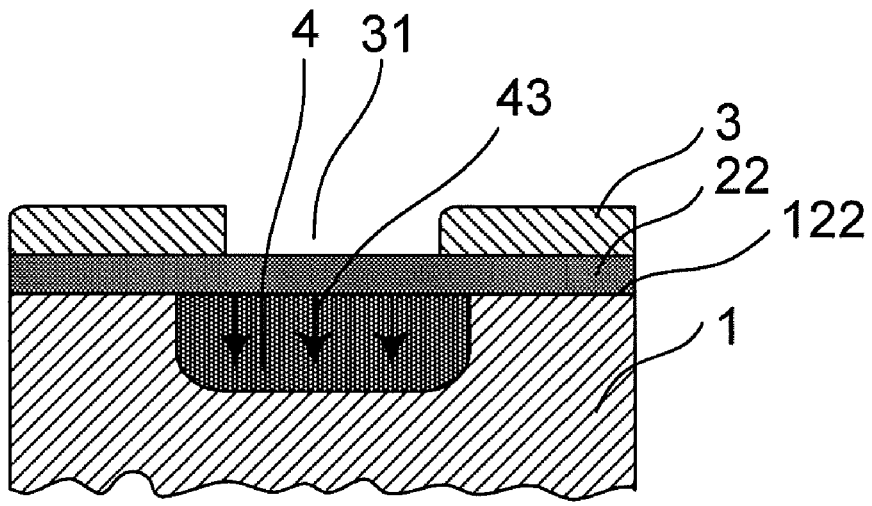
Figure 8:
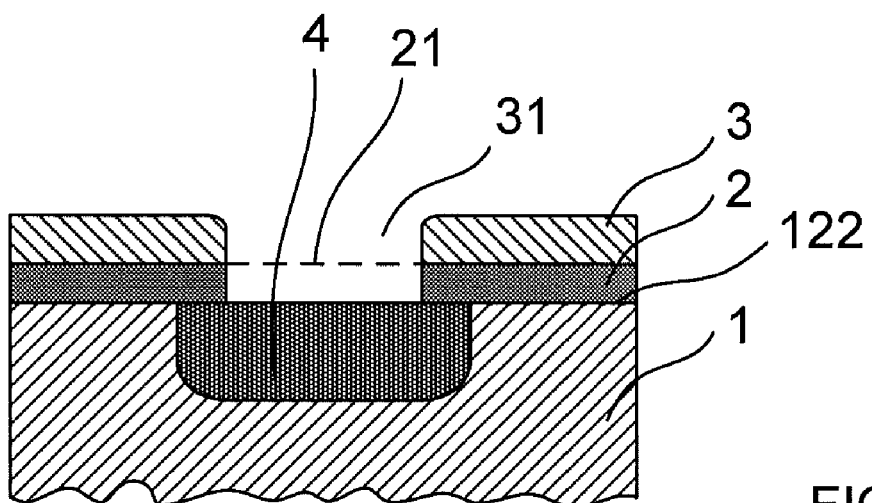
Figure 9:
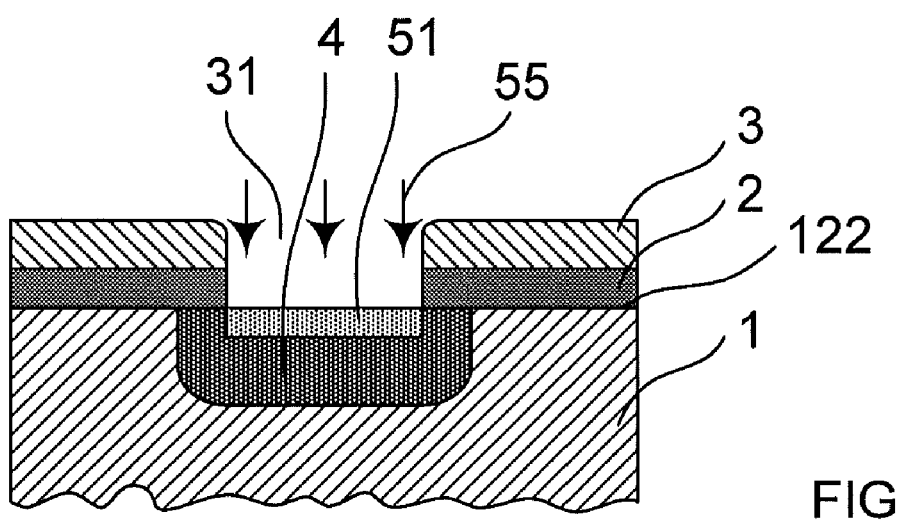

FIGS. 2 to 10 illustrate aspects of an exemplary method for manufacturing a power semiconductor device. The exemplary method can include the manufacturing steps described below and illustrated in the drawings. As shown in FIG. 2, a lightly (n−) doped substrate 1 is provided. The substrate 1 has a collector side 121 and an emitter side 122 opposite to the collector side 121. As shown in FIG. 3, a first oxide layer 22 is formed to completely cover the emitter side 122 of the substrate 1. As shown in FIG. 4, an electrically conductive layer 32 is formed on top of the first oxide layer 22. The electrically conductive layer 32 can be formed to cover the first oxide layer 22 completely. As shown in FIG. 5, an opening 31, which can be in the form of a through hole, for example, is etched in the electrically conductive layer 32, resulting in a structured gate electrode layer 3, so that part of the oxide layer 22 is now uncovered.

A first dopant of the n-conductivity type is implanted into the substrate 1 (shown by arrows 42 in FIG. 6) using the structured gate electrode layer 3 with its opening 31 as a mask, resulting in a first n-doped implant region 41. The doping concentration of the first implant region 41 is higher than the doping concentration of the drift layer 12. Afterwards, the implanted first dopant is diffused into the substrate 1 (shown by arrows 43 in FIG. 7), resulting in an enhancement layer 4. Phosphorous and/or arsenic ions can be used as the first dopant, for example. According to an exemplary embodiment, the first dopant can be implanted with an energy of 40-150 keV and/or a dose of $1*10^{12}$–$1*10^{14}$/cm$^2$. The first dopant can be driven (diffused) into the substrate 1 to a depth between 1 μm and 10 μm, Exemplary embodiments of the present disclosure provide that the first dopant can be driven into to the substrate 1 to a depth of 1 and 8 μm, or a depth 1 and 6 μm, for example. In these exemplary embodiments, the depth of diffusion is measured from the upper surface of the substrate 1, i.e., the emitter side 122.

After creating the enhancement layer 4, a portion of the first oxide layer 22 is partially removed in those areas in which the opening 31 of the structured gate electrode layer 3 is arranged. The portion of the first oxide layer 22 can be removed by etching (shown by dotted line 21 in FIG. 8), for example, or by other suitable techniques. Then, a second dopant of p− conductivity type is implanted into the base region 5 (shown by arrows 55 in FIG. 9) using the structured oxide gate electrode layer 3 with its opening 31 as a mask, resulting in a second implant region 51. Afterwards, the implanted second dopant is diffused into the base region 5 (shown by arrows 52 in FIG. 10). The second dopant can be constituted by boron, aluminum, gallium, indium ions, or any combination thereof. The second dopant can be implanted with an energy of 20-120 keV and/or a dose of $5*10^{13}$-$3*10^{14}/cm^2$. The second dopant can be driven (diffused) into the enhancement layer 4 formed in the substrate to a maximum depth 54 in a range between 0.5 µm and 9 µm from the upper surface of the enhancement layer 4. According to an exemplary embodiment, the second dopant can be diffused into the enhancement layer 4 to a depth between 0.5 and 7 µm, or between 0.5 and 5 µm, from the upper surface of the enhancement layer 4.

Figure 10:
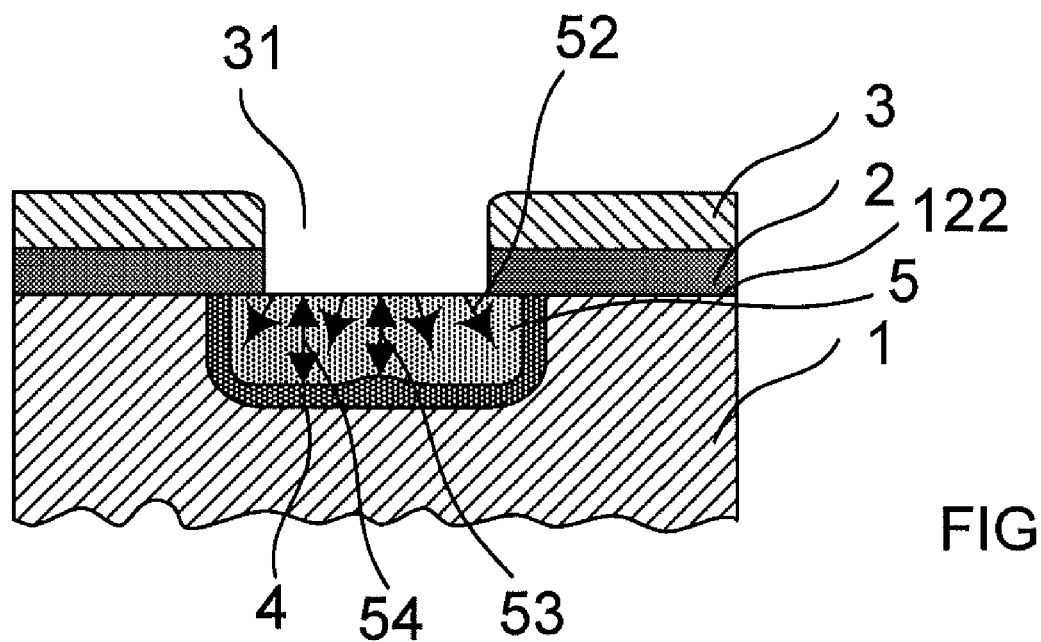

According to an exemplary embodiment, the second dopant can be driven into the substrate to a depth 53 in the central area (see FIG. 1), which is less deep than the maximum depth 54 of the base region 5, which lies in the peripheral area, i.e. outside the central area. As shown in FIG. 10, the second dopant is not only driven into the substrate 1 in a direction substantially perpendicular to the surface, but the second dopant is also spread out laterally, thus reducing the amount of the second dopant in the central area. According to an exemplary embodiment in which a born dopant was utilized and implanted with a low energy, a depth 53 of the base region 5 in the central area of 1.6 µm was achieved, as compared to a maximum depth 54 outside the central area of 2.4 µm. The energy used for the boron implantation can be between 40 and 120 keV. Exemplary ranges of energy used for the born implantation include between 70 and 90 keV, such as around 80 keV, for example.

Of course, it is also possible to make a structured gate electrode layer 3 with at least two openings 31 and thereby create at least two base regions 5, which are each surrounded by an enhancement layer 4.

Highly (n+) doped source regions 6 and the layers on the collector side 121, such as the n doped buffer layer 9, the p doped collector layer 10 and the collector electrode 11, can be manufactured at any appropriate manufacturing step and by any appropriate manufacturing method.

The foregoing exemplary embodiments were described with reference to n-type and p-type doping. It is possible to apply the exemplary embodiments of the present disclosure to a method for the manufacturing of semiconductor devices, in which the conductivity type of all layers is reversed, e.g., with a lightly (p−) doped substrate etc.

The exemplary embodiments were described above with reference to planar semiconductors. However, it is to be understood that the exemplary methods described herein can be applied to trench gate semiconductors, MOSFETs, and other semiconductor types.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

Reference List 1 substrate
2 gate oxide layer
21 area
22 first oxide layer
3 gate electrode layer
32 electrically conductive layer
31 opening
4 enhancement layer
41 first implant region
41' implant of the first dopant
42 diffusion of the first dopant
5 base region
51 second implant region
51' implant of the second dopant
52 diffusion of the second dopant
53 diffusion depth of the second dopant in central area
54 maximum diffusion depth of the second dopant
6 source region
7 insulation layer
8 emitter electrode
9 buffer layer
10 collector layer
11 collector electrode
12 drift layer
121 collector side (second main side of drift layer)
122 emitter side (first main side of drift layer)

What is claimed is:

1. A method of manufacturing a power semiconductor device, comprising:
    forming a first oxide layer on a first main side of a substrate of a first conductivity type;
    forming a gate electrode layer with at least one opening on the first main side on top of the first oxide layer,
    forming an enhancement layer by implanting a first dopant of the first conductivity type into the substrate on the first main side using the formed gate electrode layer as a mask, and by diffusing the first dopant into the substrate; and
    forming a base layer by implanting a second dopant of a second conductivity type into the substrate on the first main side, and by diffusing the second dopant into the substrate such that the base layer has a lower depth in a central area below the at least one opening, the depth of the base layer in the central area being shallower than a maximum depth to which the base layer extends in a peripheral area,
    wherein the first oxide layer is partially removed after diffusing the first dopant into the substrate and before implanting the second dopant into the substrate, and the gate electrode layer is used as a mask for implanting the second dopant.

2. The method according to claim 1, comprising removing the first oxide layer in areas in which the at least one opening of the gate electrode layer is arranged to form a gate oxide layer.

3. The method according to claim 1, wherein the first dopant is at least one of phosphorous and arsenic ions.

4. The method according to claim 1, wherein the first dopant is implanted with at least one of an energy of 40-150 keV and a dose of $1*10^{12}$-$1*10^{14}/cm2$.

5. The method according to claim 1, wherein the first dopant is diffused into the substrate to a depth of at least 1μm from an upper surface of the substrate.

6. The method according to claim 1, wherein the second dopant is at least one of boron, aluminum, gallium and indium ions.

7. The method according to claim 1, wherein the second dopant is implanted with at least one of an energy of 20-120 keV and a dose of $5*10^{13}-3*10^{14}$/cm2.

8. The method according to claim 1, wherein the second dopant is diffused into the substrate to a maximum depth in a range between 0.5μm and 9μm from an upper surface of the substrate.

9. The method according to claim 2, wherein the first dopant is at least one of phosphorous and arsenic ions.

10. The method according to claim 3, wherein the first dopant is implanted with at least one of an energy of 40-150 keV and a dose of $1*10^{12}-1*10^{14}$/cm2.

11. The method according to claim 1, wherein the first dopant is diffused into the substrate to a depth in the range of 1μm to 10μm from an upper surface of the substrate.

12. The method according to claim 11, wherein the first dopant is diffused into the substrate to a depth in the range of 1μm to 8μm from the upper surface of the substrate.

13. The method according to claim 11, wherein the first dopant is diffused into the substrate to a depth in the range of 1μm to 6μm from the upper surface of the substrate.

14. The method according to claim 4, wherein the first dopant is diffused into the substrate to a depth in the range of 1μm to 10μm from an upper surface of the substrate.

15. The method according to claim 6, wherein the second dopant is implanted with at least one of an energy of 20-120 keV and a dose of $5*10^{13}-3*10^{14}$/cm2.

16. The method according to claim 7, wherein the second dopant is diffused into the substrate to a maximum depth in a range between 0.5μm and 7μm from the upper surface of the substrate.

17. The method according to claim 8, wherein the second dopant is diffused into the substrate to a maximum depth in a range between 0.5μm and 5μm from the upper surface of the substrate.

18. The method according to claim 15, wherein the second dopant is diffused into the substrate to a maximum depth in a range between 0.5μm and 9μm from an upper surface of the substrate.

19. The method according to claim 1, comprising: forming source regions of the first conductivity type on the first main side, the source regions being higher doped than the substrate.

* * * * *